US010481186B2

(12) United States Patent
Keister et al.

(10) Patent No.: US 10,481,186 B2
(45) Date of Patent: Nov. 19, 2019

(54) COMBINED DC CURRENT, AC CURRENT AND VOLTAGE SENSOR FOR HIGH VOLTAGE ELECTRIC POWER LINES

(71) Applicant: Southern States, LLC, Hampton, GA (US)

(72) Inventors: Josh Keister, Hampton, GA (US); Joseph R Rostron, Hampton, GA (US); Jiyuan Fan, Hampton, GA (US); Tan Tran, Hampton, GA (US)

(73) Assignee: Southern States, LLC, Hampton, GA (US)

( * ) Notice: Subject to any disclaimer, the term of this patent is extended or adjusted under 35 U.S.C. 154(b) by 54 days.

(21) Appl. No.: 15/971,991

(22) Filed: May 4, 2018

(65) Prior Publication Data

US 2018/0321286 A1 Nov. 8, 2018

Related U.S. Application Data

(60) Provisional application No. 62/501,798, filed on May 5, 2017.

(51) Int. Cl.
*G01R 19/25* (2006.01)
*G01R 21/06* (2006.01)
(Continued)

(52) U.S. Cl.
CPC ....... *G01R 19/2513* (2013.01); *G01R 15/142* (2013.01); *G01R 15/18* (2013.01); (Continued)

(58) Field of Classification Search
None
See application file for complete search history.

(56) References Cited

U.S. PATENT DOCUMENTS 4,796,027 A 1/1989 Smith-Vaniz
2006/0076946 A1 * 4/2006 Shvach .................. G01D 21/00 324/126

(Continued)

*Primary Examiner* — Clayton E. LaBalle
*Assistant Examiner* — Jas A Sanghera
(74) *Attorney, Agent, or Firm* — Mehrman Law Office; Michael J. Mehrman

(57) ABSTRACT

The present invention may be embodied in an in-line high voltage electric power line monitor including a DC current sensor, an AC current sensor, a voltage sensor, an energy harvesting power supply, and a communication device configured. The in-line power line monitor includes a bus bar that connects in series with the monitored power line. For example, the in-line power line monitor may be connected at the junction point between the monitored power line and a support structure, such a sectionalizing switch that supports the monitor positioned between the switch and the power line. A pair of DC current measurement pickups are spaced apart on the bus bar and operatively connected to the microprocessor. The in-line power line monitor also includes an AC current sensor coil and an energy harvesting device (e.g., inductive coil) that surround the bus bar. The AC current sensor coil, the power supply coil and the voltage sensor positioned adjacent to, but spaced apart from, the bus bar. An electronics board pair carries a pair of foil patch voltage sensors and a pair of foil patch antenna elements positioned adjacent to the outer perimeter of the electronics board. Although the in-line power line monitor does not require a separate power supply, the electronics board may carry a backup battery if desired.

20 Claims, 6 Drawing Sheets

(51) Int. Cl.

| | |
|---|---|
| ***G01R 15/14*** | (2006.01) |
| ***G01R 21/133*** | (2006.01) |
| ***H05K 9/00*** | (2006.01) |
| ***G06F 1/26*** | (2006.01) |
| ***G01R 15/18*** | (2006.01) |

(52) U.S. Cl.

CPC ........... *G01R 15/181* (2013.01); *G01R 21/06* (2013.01); *G01R 21/133* (2013.01); *G06F 1/26* (2013.01); *H05K 9/0081* (2013.01)

(56) References Cited

U.S. PATENT DOCUMENTS

| | | | |
|---|---|---|---|
| 2008/0077336 | A1 | 3/2008 | Fernandes |
| 2008/0246507 | A1 | 10/2008 | Gunn et al. |
| 2010/0084920 | A1 | 4/2010 | Alex |
| 2012/0046799 | A1 | 2/2012 | Alex et al. |

* cited by examiner

COMBINED DC CURRENT, AC CURRENT AND VOLTAGE SENSOR FOR HIGH VOLTAGE ELECTRIC POWER LINES

REFERENCE TO RELATED APPLICATION

This application claims filing priority to U.S. Provisional Patent Application Ser. No. 62/501,798 filed May 5, 2017, which is incorporated by reference.

TECHNICAL FIELD

The present invention relates to the field of high voltage electric power transmission and distribution systems and, more particularly, to a combined DC current, AC current and voltage electric power sensor with an onboard energy harvesting power supply and wireless communication device.

BACKGROUND OF THE INVENTION

At present, ring-type current transformers ("CTs") are the most prevalent technology for measuring phase currents in three-phase electric power transmission and distribution lines. Conventional CTs are often placed in physical contact with the monitored power line conductor, which results in excessive heating of the CT and the power line. Excessive heating can adversely impact electronics in the CT and limit the current carrying capacity of the power line. Conventional CTs are also limited to electric current measurement, resulting in the need for separate voltage sensors when both current and voltage measurement are desired. Conventional CTs also require separate radios to transmit the current measurements to controllers or remote transmission units (RTUs). These radios are typically powered by batteries or separate low voltage wiring. Batteries require periodic maintenance, while low voltage wiring requires a nearby transformer, which increases the cost and maintenance requirements.

In addition to current measurement, power line voltage measurement is also useful for "smart grid" electric power system monitoring, protection and control. Traditional voltage measurement devices, while accurate, are expensive and physically large, which limits the number of electric power circuit locations where they can be cost effectively be deployed. High voltage sensors are presently available, but the conventional voltage sensing techniques are usually sensitive to electromagnetic interference errors (also referred to as "cross talk" or "contamination") caused by other high voltage power lines and devices in close proximity. In addition, many conventional voltage sensors are non-directional, which renders them particularly susceptible to electromagnetic contamination. Electromagnetic contamination also impairs the measurement of the voltage phase angle, which is critical for VAR measurement, capacitor switching for voltage support, and sophisticated direction-to-fault and distance-to-fault sectionalizing techniques.

A high voltage sensor in the form of a circuit board carrying a foil patch sensor has been used to obtain advantages over physically large capacitor and transformer-based systems. The small size and low cost of foil patch sensors allows for information gathering at a larger number of measurement points, which provides more accurate and robust determination of power outages and poor power quality conditions. However, conventional capacitive foil patch sensors are typically non-directional, which makes them susceptible to significant cross talk from nearby high voltage power lines and devices. While a line mounted patch sensor with a ground plane positioned adjacent to the power line experiences relatively good coupling to the power line, nearby power lines and other high voltage devices, such as disconnect switches and equipment bushings, can still cause significant cross talk.

Conductive shielding and mathematical filtering are other techniques that have been used to avoid or compensate for electromagnetic cross talk. However, conductive shielding can be physically challenging to design and mathematical filtering is complicated by variations in capacitance caused by changing environmental factors. Voltage sensors are generally physically mounted to a support made from a dielectric medium, such as epoxy, Teflon or porcelain. While the nominal capacitances of these materials are generally well known, the actual capacitance in the field can vary significantly with changes in environmental temperature, moisture and surface contamination. For example, the sensor capacitance can change with changes in physical dimensions resulting from thermal expansion. Power line conductors experience physical sag, which can be significantly impacted by the ambient temperature. In addition, the intrinsic dielectric constant of some materials can change with temperature. While the majority of these effects can be compensated for by measuring the temperature of the local mechanical support and using a calibration table to account for these changes in capacitance, this increases the cost and complexity of the measurement system.

Moreover, temperature compensation may not be sufficient in some cases because sensor performance can also vary significantly due to the surface condition of the physical sensor support. Any type of electrically conductive surface contamination can drain the electric charge from the sensor and impact the phase angle response characteristic of the sensor. These parasitic effects are caused by a resistive layer, such as water, ice, oxidation or grime, on the surface of the sensor support or housing. Resistive surface contamination can significantly change the measured phase angle with respect to the voltage field and reduce the signal magnitude available to measure. Moisture or high humidity in the ambient air can exasperate these sensor impacts. While these contamination effects do not significantly influence the high voltage field itself, they do affect the signal measurement in both magnitude and phase angle.

Solar storms can cause geomagnetic disturbances that produce direct current ("DC") currents in electric power transmission systems. These DC currents can saturate grounded transformer windings, which can overheat the transformers and cause voltage instability problems. This leads to power outages and component failure. Conventional CTs are unable to measure the DC component of power line currents, which prevents electric utility system operators from taking appropriate actions. Moreover, conventional protection relays are unable to react to DC current because they are only configured to respond to very high AC fault currents.

High resolution analog-to-digital converters are now available to measure DC currents in the presence of high power alternating current ("AC") currents. Other techniques can be used to improve the accuracy DC current measurement. For example, the skin effect of DC versus AC current can be used to separate the AC current signal from the DC current signal. In addition, a 50/60 Hz notch filter with DC gain can be used to increase the accuracy of the DC measurement and flatten the frequency response of the conductor impedance. Another technique uses an AC-coupled signal to remove the DC component and then subtract the AC-only signal from the original. Averaging across the 50/60 Hz power cycle window can also be used to reject the fundamental AC frequency and leave the DC component.

However, these approaches are generally expensive, require complicated signal processing, and prone to cross talk errors from stray voltage sources. As a result, there is a persistent need for improved current and voltage sensors for high voltage power lines. There is a particular need for high voltage electric power line monitors capable of measuring DC currents, AC currents and voltages with onboard communication features suitable for placement in many circuit locations in smart-grid applications.

SUMMARY OF THE INVENTION

The present invention meets the needs described above through an electric power monitoring device, system and method for an in-line electric power line monitoring device. In an illustrative embodiment, the device includes a bus bar configured to be connected in-line with an electric power line conductor. An electronics board is positioned transverse to the bus bar with the bus bar extending through the electronics board. Electronic components carried on the electronics board include a microprocessor, a memory and a radio, operatively connected to the microprocessor. A voltage sensor and an antenna are carried on the electronics board and operatively connected to the microprocessor. A pair of DC current measurement pickups are spaced apart on the bus bar and operatively connected to the microprocessor. A power supply coil is operatively connected to the microprocessor and positioned transverse to the bus bar with the bus bar extending through the power supply coil. The power supply coil is configured to harvest electric energy from the power line conductor and provide the harvested electric energy to power the electronic components. An AC current sensor coil is operatively connected to the microprocessor and positioned transverse to the bus bar with the bus bar extending through the AC current sensor coil. An electronics board cover is positioned transverse to the bus bar with the bus bar extending through the electronics board cover. An end plate positioned transverse to the bus bar with the bus bar extending through the end plate, with the electronics board, the DC current measurement pickups, a power supply coil, and the AC current sensor coil positioned between the electronics board cover and the end plate. In addition to measuring the DC current, the bus bar may also be used as a sensing element may to measure AC fault currents that are far above the capability of a traditional CT. This is because the bus bar cannot saturate with current, while the measurement core of a CT can saturate with magnetic flux. As a result, the size of the core limits the magnitude of fault current that a CT can measure. In addition, the inductance of the bus bar causes it to have a higher impedance than its resistance. This causes the bus bar to have separate AC and DC gain responses, which is useful in computing the AC and DC current values from the voltage and temperature parameters directly measured by the sensors.

The voltage sensor may include a foil patch voltage sensor, and the antenna may include a foil patch antenna element. The electronic elements may be carried on a side of the electronics board, while the foil patch voltage sensor and the foil patch antenna element are carried on an opposing side of the electronics board. The voltage sensor may include four foil patch voltage sensor elements; and the antenna may include two foil patch antenna elements. The electronica board may have a round shape, while the voltage sensor elements each form approximately 90° arc segments positioned end-to-end adjacent to the outer perimeter of the electronics board.

In addition, the antenna may include a first foil patch antenna element that transmits communication signals having a first polarity and a second foil patch antenna element that transmits communication signals having a second polarity orthogonal to the first polarity. The in-line sensor may also include a temperature sensor that generates a temperature signal representative of the bust bar temperature, which the microprocessor uses in temperature compensated computation of DC current flowing in the bus bar. The in-line electric power line monitoring device may also include a first bracket connecting the electronics board cover to the bus bar, and a second bracket connecting the end plate to the bus bar. As another feature, the electronic components may also include a GPS device.

The specific techniques and structures for implementing particular embodiments of the electric power monitoring and response system, and thereby accomplishing the advantages described above, will become apparent from the following detailed description of the embodiments and the appended drawings and claims.

DETAILED DESCRIPTION OF ILLUSTRATIVE EMBODIMENTS

The present invention may be embodied in an in-line high voltage electric power line monitor including a DC current sensor, an AC current sensor, a voltage sensor, an energy harvesting power supply, and a communication device configured. The in-line power line monitor includes a bus bar that connects in series with the monitored power line. For example, the in-line power line monitor may be connected at the junction point between the monitored power line and a support structure, such a sectionalizing switch that supports the monitor positioned between the switch and the power line. A pair of DC current measurement pickups are spaced apart on the bus bar o and operatively connected to the microprocessor. The in-line power line monitor also includes an AC current sensor coil and an energy harvesting device (e.g., inductive coil) that surround the bus bar. The AC current sensor coil, the power supply coil and the voltage sensor positioned adjacent to, but spaced apart from, the bus bar. An electronics board pair carries a pair of foil patch voltage sensors and a pair of foil patch antenna elements positioned adjacent to the outer perimeter of the electronics board. An advantage of wireless sensor measurement for voltage or current is that there is no risk of an insulation failure or safety hazard with a breakdown to the low voltage side from the high voltage line. Although the in-line power line monitor does not require a separate power supply, the electronics board may carry a backup battery if desired. The voltage sensing plate and housing may be protected with a material that contains oil or another hydrophobic substance. Surface treatments for the foil patches should generally be applied to housing materials as well.

A typical circuit monitoring and control installation includes three in-line power line monitors (one for each line phase), a controller, a switch actuator, and an optional analog module for interfacing with electronic relays and a remote transmission unit (RTU). The system may provide real time waveform captures. Specialized algorithms may be programmed into the controller. Typical applications include sectionalizing switches, switches that determine distance-to-fault and direction-to-fault, renewable generation tie switches, load tie switches, automatic reclosers, EHV monitoring, capacitor bank control, voltage regulator control, transformer protection, reactor switch control, and so forth. For example, the combined current and voltage sensor can be used in the fault detection, isolation and restoration systems described in U.S. Pat. Nos. 8,392,130; 8,659,862; 8,717,721; 8,861,155; 8,866,487; 9,823,637 and 9,581,624, which are incorporated by reference.

Figure 1:
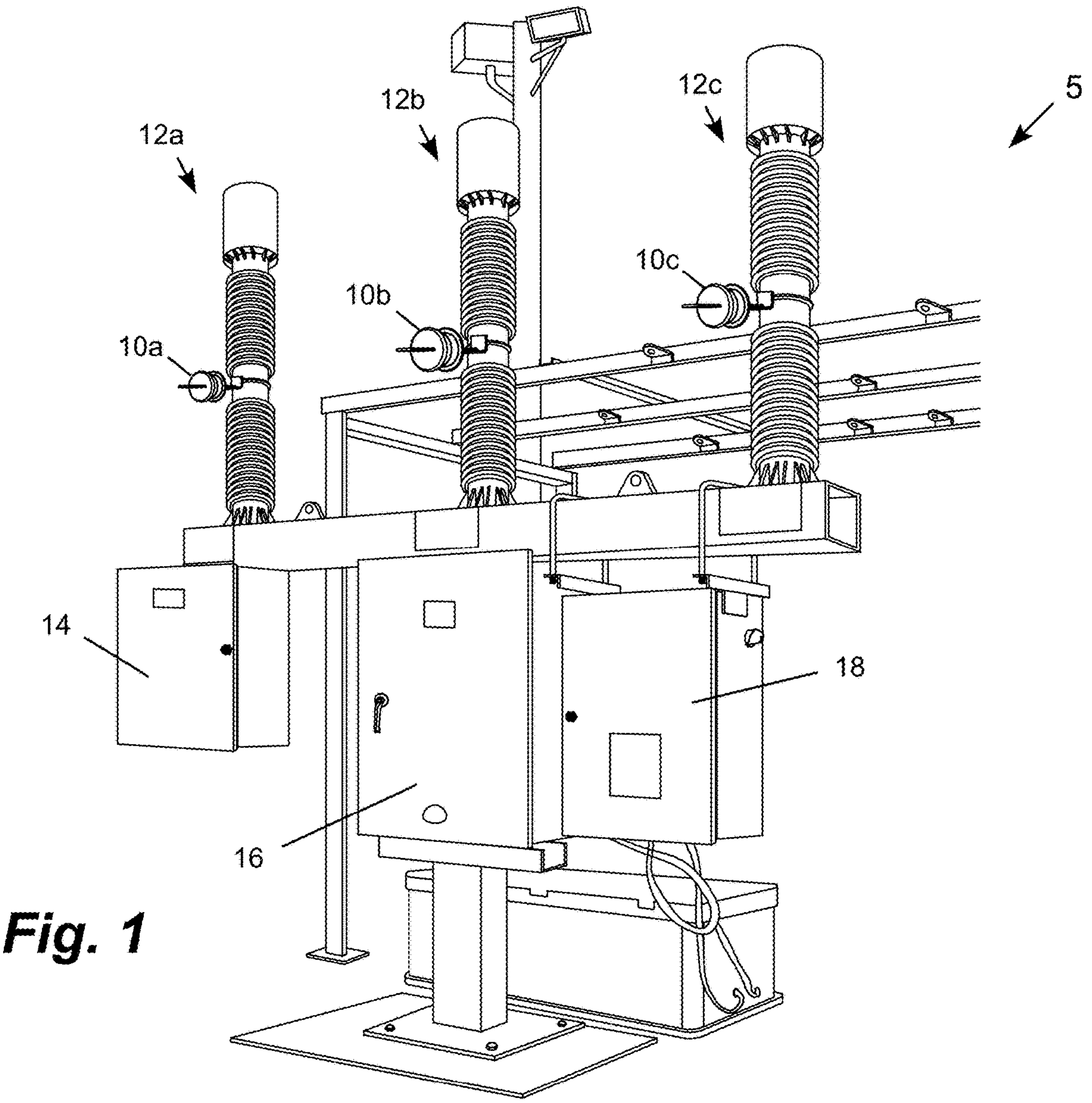
FIG. 1 is a perspective view of a high-voltage power line switch including three in-line power line monitors supported by respective switches.

FIG. 1 is a perspective view of a high-voltage power line switch 5 that includes three in-line power line monitors 10*a-c* supported by respective electric power switches 12*a-c* (e.g., sectionalizing switches). Each in-line power line monitor measures DC current, AC current and AC voltage on its respective power line and transmits those measurements wirelessly to a controller unit 14. This particular illustrative power line switch 5 also includes an actuator 16 for operating the switch based on the measured current and/or voltage measurements. This installation also includes a Remote Transmission Unit (RTU) 18 (such as a SCADA unit) for communicating the power line measurements to local and/or remote control centers, which may record, analyze and display the power line measurements and control a variety of response equipment based on the power line measurements and associated computations.

Figure 2:
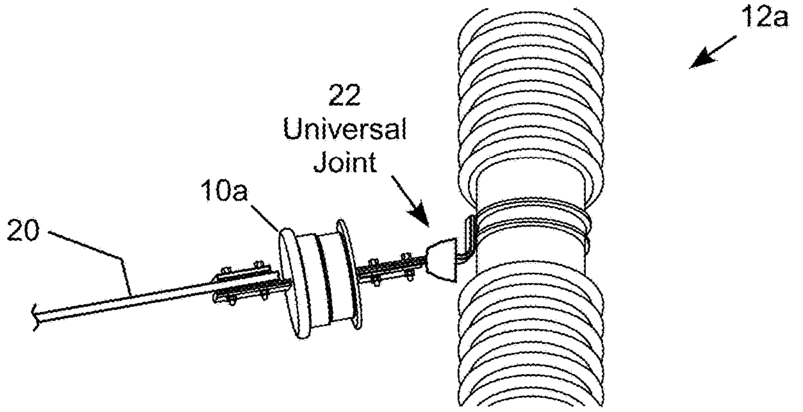
FIG. 2 is a perspective view of in-line power line monitor supported by a switch.

FIG. 2 is a perspective view of one of the in-line power line monitors 10*a* supported one of the switches 12*a* in line with a monitored power line 20. The in-line power line monitor may be connected to the switch tap by a universal joint 22, which may alternatively be located at the junction between the in-line power line monitor and the power line. The in-line power line monitor is typically capable of capturing three phase GPS location and time stamped voltage and current waveforms both before and after fault events using a common reference clock (e.g., common GPS clock), which may be stored, analyzed and used for real-time power system control. Three phase voltage and current monitoring enables distance-to-fault local or remote controllers to conduct distance-to-fault and direction-to-fault computations, and control response equipment, such as sectionalizing switches, tie switches, capacitor switches, reactor switches, voltage regulators, renewable generation sources, load switches, and so forth. One important function, for instance, is to detect back-fed power from distributed generation sources (e.g., solar panel generators) during power line fault detection and restoration to enhance safety during fault isolation and restoration.

The voltage sensor is carried on an electronics board positioned transverse to the monitored power line with the bus bar extending through the electronics board. The DC current sensor, the AC current sensor and the voltage sensor are configured to positioned adjacent to, but spaced apart from, the monitored power line. The voltage sensor and communications antenna are configured as capacitive foil patches carried on the electronics board. Although the power line monitor does not require a separate power supply, the electronics board may carry a backup battery if desired or be connected to a low voltage power source if desired. The voltage sensing plate and housing may be protected with a material that contains oil or another hydrophobic substance.

Figure 3:
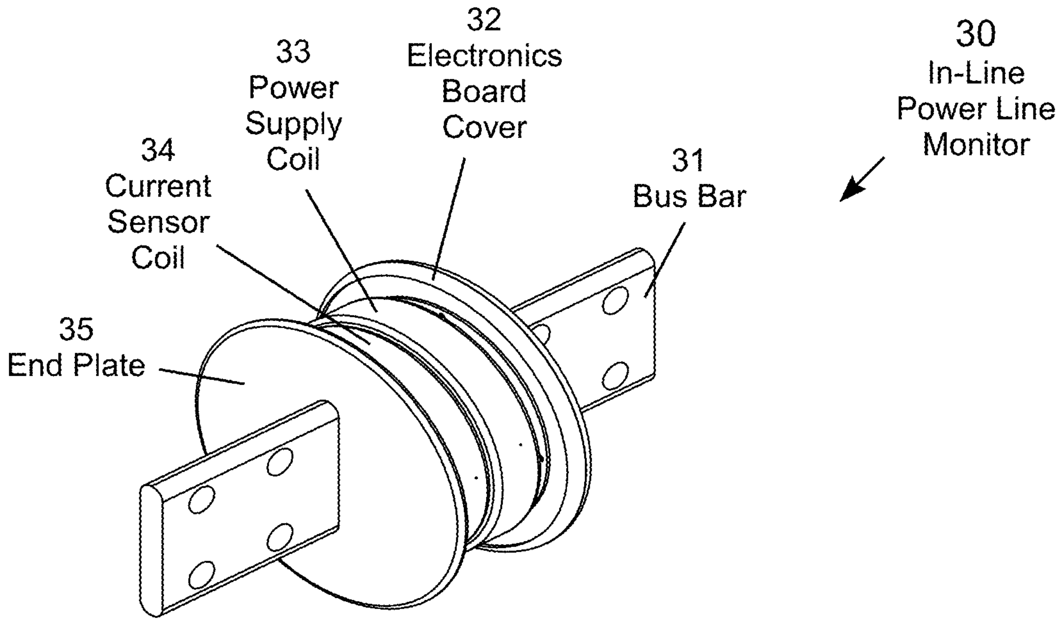
FIG. 3 is a perspective view of the in-line power line monitor.
Figure 4:
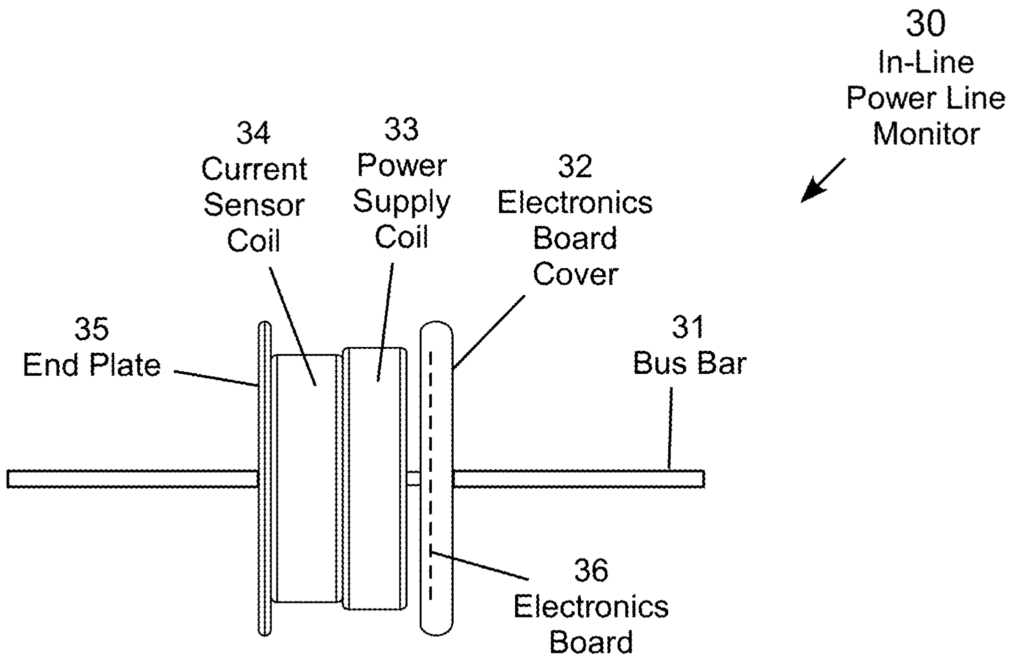
FIG. 4 is a side view of the in-line power line monitor.
Figure 5:
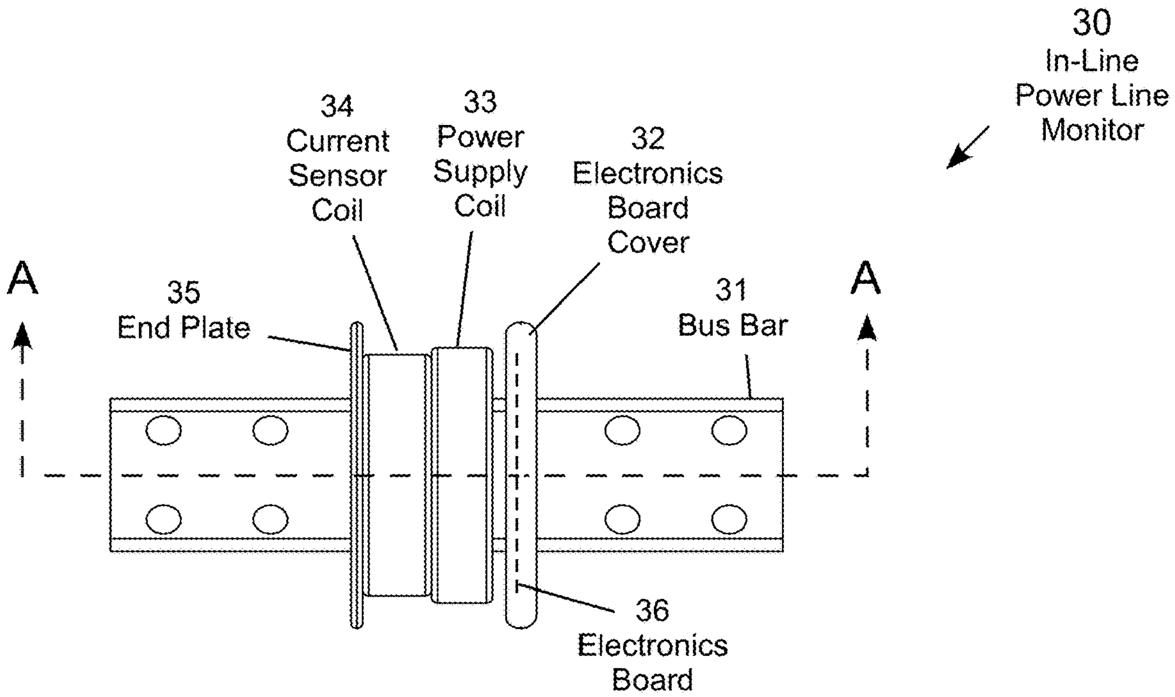
FIG. 5 is a top view of the in-line power line monitor.
Figure 6:
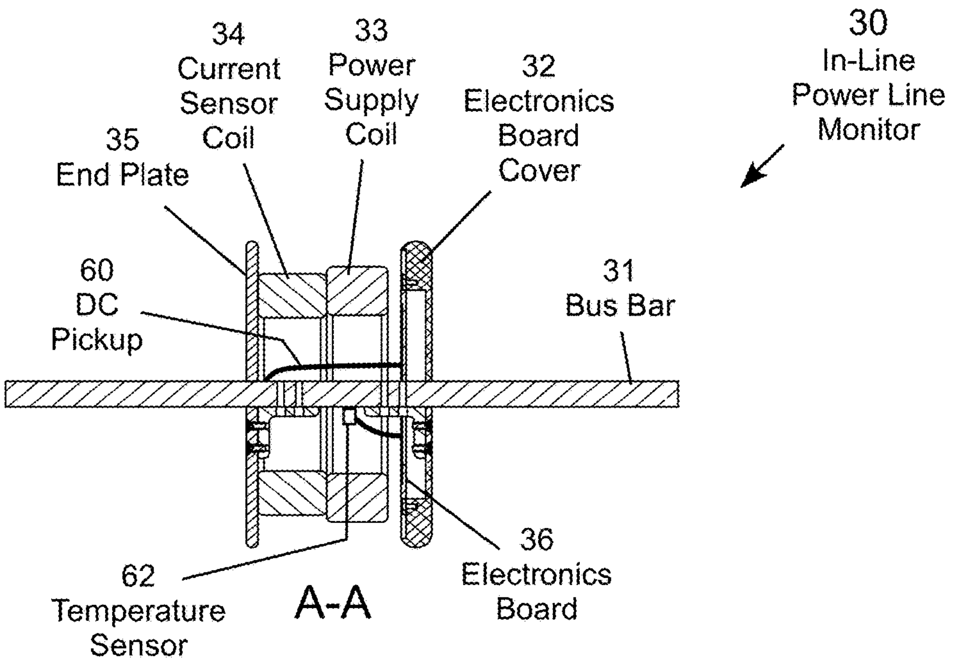
FIG. 6 is a side section view of the in-line power line monitor.
Figure 7:
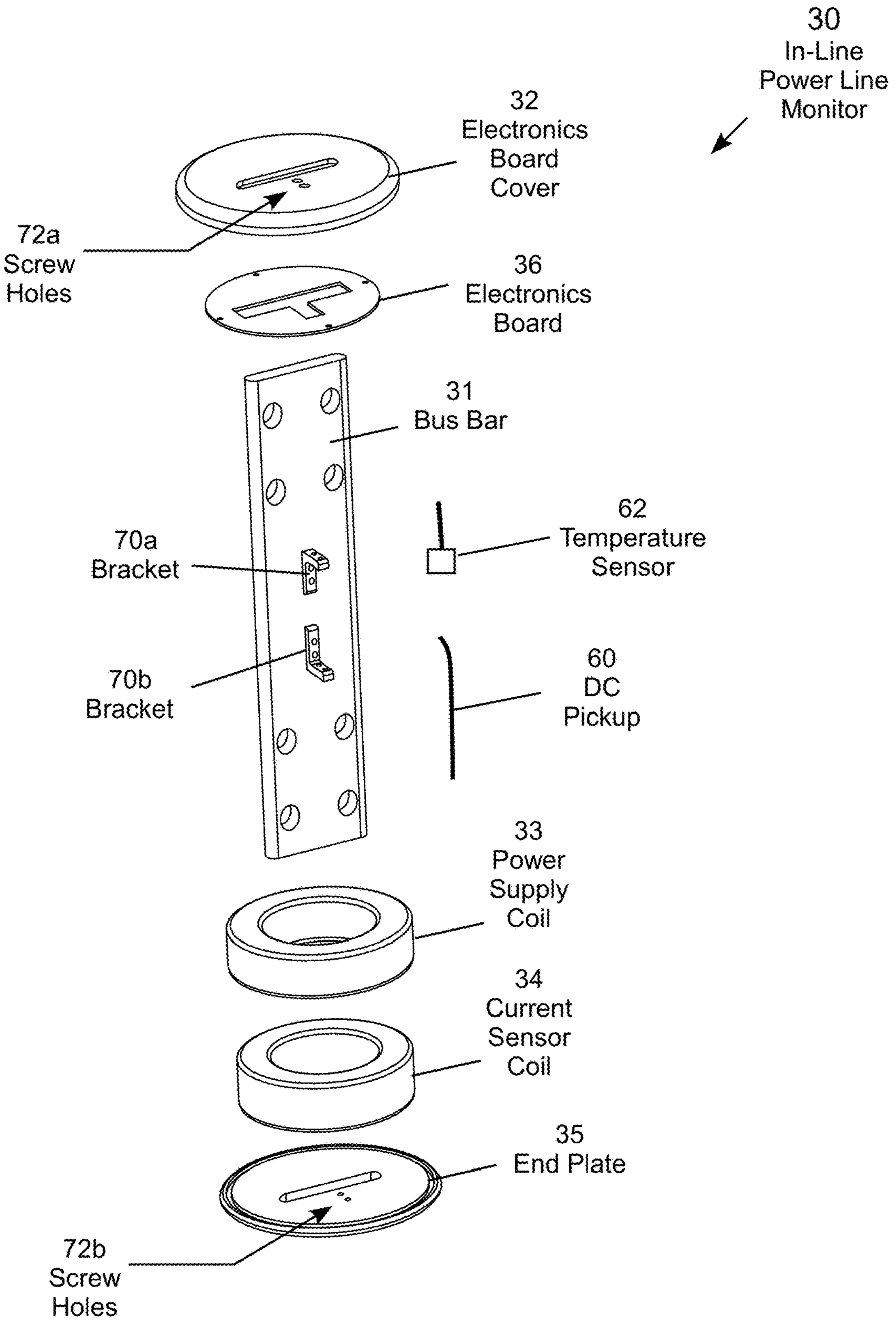
FIG. 7 is an assembly view of the in-line power line monitor.

FIG. 3 is a perspective view, FIG. 4 is a side view, FIG. 5 is a top view showing section line A-A, FIG. 6 is shows section A-A, and FIG. 7 is an assembly view of an illustrative in-line power line monitor 30 including a bus bar 31. This illustrative embodiment includes an electronics board cover 32, a power supply coil 33, a current sensor coil 34, and an end plate 35 arranged sequentially on the bus bar 31. FIGS. 6 and 7 show the DC pickup 60 and the temperature sensor 62 that provide signals used by the microprocessor to compute the DC current flowing in the bus bar. The electronics board cover 32 houses an electronics board 36 that is attached by screws or other suitable fasteners to the electronics board cover. The electronics board cover 32 is typically made from a plastic or other suitable non-conductive material that does not interfere with radio transmissions from the antenna elements 83*a-b* in a desired direction (e.g., to the right as shown in FIGS. 3-7). The antenna board may carry a conductive antenna shield protecting the antenna elements 83*a-b* from electromagnetic interference propagating from the opposing direction (e.g., from the left as shown in FIGS. 3-7) while allowing communication signals to propagate from the antenna elements in the desired direction.

As shown in FIG. 6, a first DC current measurement pickup 60 connects to the bus bar 31 near the end plate 35. A second DC current measurement pickup connects to the bus bar 31 near the electronics board 36. In addition, a temperature measurement device 62 mounted on the bus bar 31 provides a temperature measurement signal representative of the temperature of the bus bar to the electronics board 36. The microprocessor on the electronics board uses the bus bar temperature measurement signal for temperature compensation in the computation of the DC current flowing in the bus bar. The microprocessor on the electronics board may also uses the temperature measurement signal from the temperature measurement device 62 for temperature compensation in the computation of the AC current and/or voltage of the monitored power line.

As shown in FIG. 7, the bus bar 31 carries two brackets 70*a-b*. The electronics board cover 32 carrying the electronics board 36 is attached to the first bracket 70*a* with screws extending through screw holes 72*a* in the electronics board cover. The power supply coil 33 and the current sensor coil 34 are attached to the end plate 35 with an adhesive. These components are attached to the second bracket 70*b* with screws extending through screw holes 72*b* in the end plate.

Figure 8:
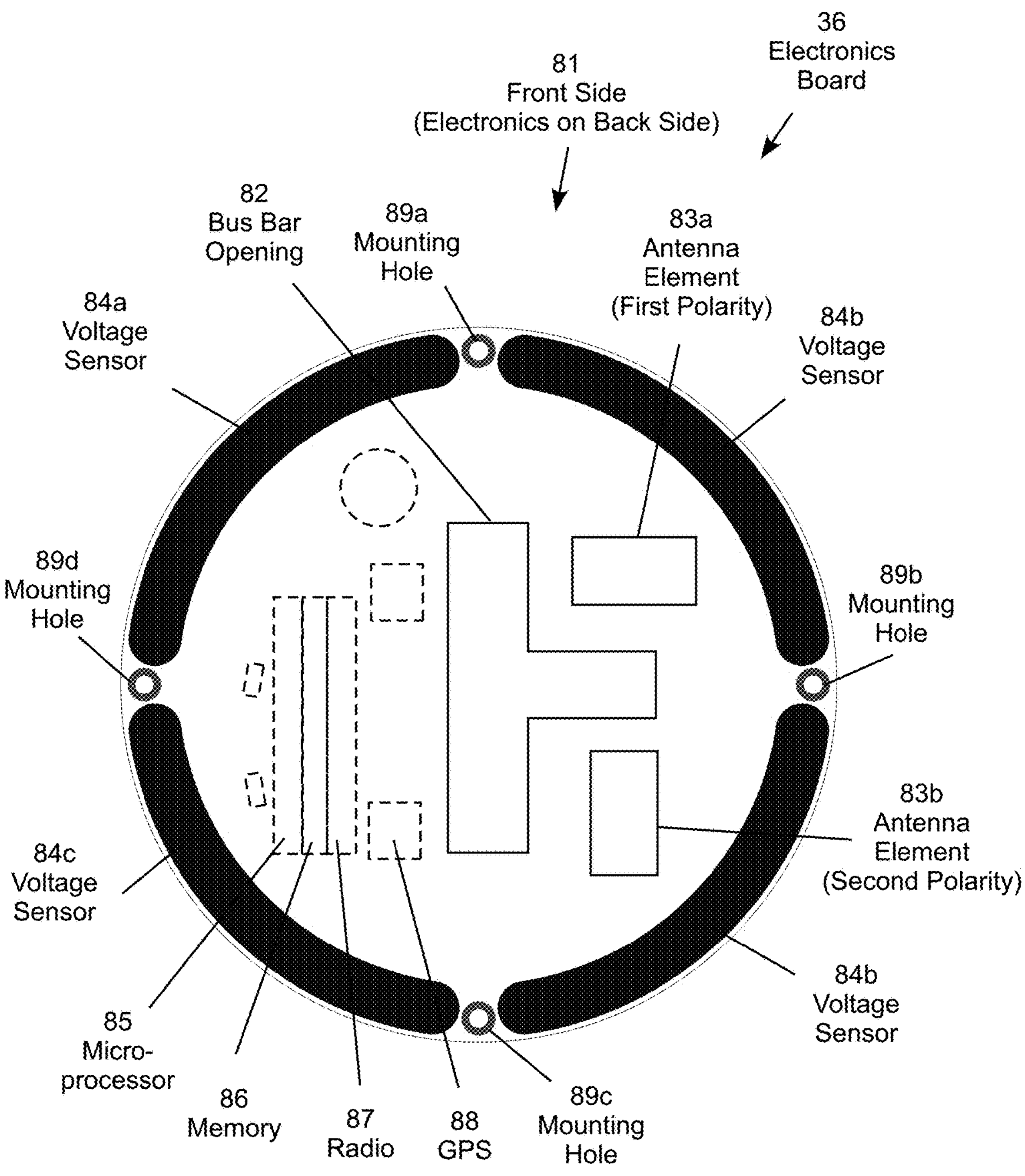
FIG. 8 is conceptual illustration of an electronics board for the in-line power line monitor.

FIG. 8 is conceptual illustration of the electronics board 36 for the in-line power line monitor. FIG. 8 shows the front side 81 of the circular electronics board in solid lines with the electronic components on the other side of the board shown in dashed lines. The electronics board includes an opening 82 for the bracket 70*a* (shown in FIG. 7). The front side 81 of the electronics board 36 carries two foil patch antenna elements 83*a-b*, which are typically transmit communication signals at two orthogonal polarities. The communication signals may also be transmitted at different frequencies. The front side 81 of the electronics board 36 also carries four foil voltage sensors 84*a-d* positioned adjacent to the outer perimeter of the electronics board. In this embodiment, the electronics board 36 is round and the four voltage sensor elements 84*a-d* each comprise approximately 90° foil patch arc segments positioned end-to-end adjacent to the outer perimeter of the electronics board.

Figure 9:
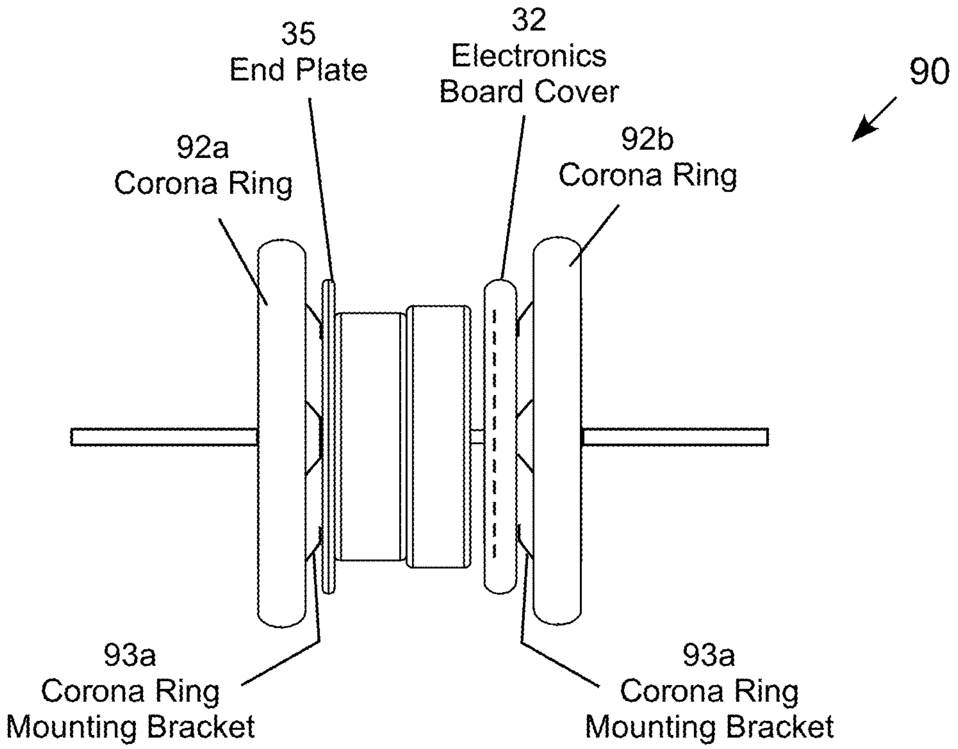
FIG. 9 is a side view of an in-line power line monitor with a corona ring.
Figure 10:
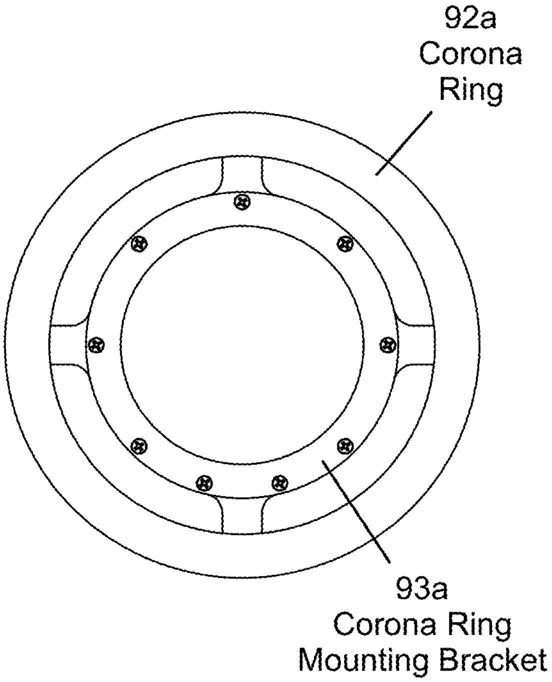
FIG. 10 is front view of the corona ring.

FIG. 9 is a side view of an in-line power line monitor 90 with corona rings 92*a-b* and corona ring mounting brackets 93*a-b* that attach the corona ring to the end plate 35 and the electronics board cover 32, respectively, with suitable fasteners, such as screws. FIG. 10 is front view of one of the corona rings 92*a* and its associated corona ring mounting bracket 93*a*, which are typically made of a conductive material such as aluminum.

The electronic components on the other side of the electronics board (shown n dashed lines) include a microprocessor 85, memory 86, radio 87, GPS unit 88 and supporting components. The DC current measurement pickups, the voltage sensor, the antenna, and the radio, memory and GPS unit are all operatively connected to the microprocessor, which controls the operation of the in-line power line monitor. The microprocessor typically performs additional functions including GPS position and time stamp determination for captured voltage and current waveforms.

The radio 87 is operatively connected to the antenna elements 83*a-b* to communicate power line measurements to other devices, such as the controller 14 and RTU 18 shown in FIG. 1. The antenna elements 83*a-b* typically communicate signals at orthogonal polarities to provide multi-element, dual polarity communication reliability. Elements may be configured as a single chip or as multiple chips as a matter of design choice. While a variety of radio channels maybe used, the radio 87 may use the 2.4 GHz and/or 900 MHZ radio bands.

If the electronics board cover 32 is made of a non-conductive material, the side of the electronics board 36 carrying the electronic components may also carry conductive antenna shields positioned across the board form the antenna elements on the other side of the electronics board. The antenna shields effectively form conductive Faraday shields that protect the foil patch antenna elements and associated signal traces from electromagnetic interference radiating from the monitored power line and other sources.

In this embodiment, the voltage sensors 84*a-d* and antenna elements 83*a-b* are configured as foil patches disposed on the circuit board to provide an inexpensive yet highly robust design. The illustrative in-line power line monitor advantageously includes four voltage sensors 84*a-d* with separate capacitive sensors and signal paths, along with dual antenna elements 83*a-b* with separate signal paths. As an option, each voltage sensor patch operates on a different radio frequency, and antenna patch operates on a different radio frequency, to provide a dual redundant radio design. This option enhances radio robustness by preventing random radio signals that interfere with any one radio frequency from fully interrupting the sensor. As radio frequency interference typically occurs on a single frequency at any particular time, the dual redundant radio design of the in-line power line monitor provides inherent reliability for transmission of real time measurement data. As another option, data packet transmissions are repeated in time as another technique to enhance transmission reliability. In other words, each data packet transmission is duplicated during one or more subsequent time intervals. On a power system, power fault and surge events typically interrupt RF operation for very short periods in the millisecond range. Repeating the transmission of a data packet after a few milliseconds is therefore an effective way of ensuring that the information in the packet is not lost due to a typical power line surge or fault event.

In addition, the voltage sensors 84*a-d* can be used as a trickle charger for the power supply. This technique is useful for periodically transmitting “I'm alive” heart beat type signals regardless of whether the inductive power supply coil is generating power. As a result, this energy harvesting technique is operative when the monitored power line has voltage but does not require current to be flowing on the monitored power line. Due to the small amount of power harvested with this technique, it is best suited to producing a periodic status alert. As additional options, trickle charge energy can be harvested from an RF signal transmitted by a ground-based transmitted or even the signals transmitted by cell phone towers, SCADA towers, or other sources of REF energy in the ambient environment. See, for example, U.S. Pat. No. 8,392,130, which is incorporated by reference.

The in-line power line monitor 30 is shown approximately to scale in the figures where the end plate 35 approximately 6 (15 cm) in diameter and the corona rings 92*a-b* approximately 8 inches (20 cm) in diameter. The in-line power line monitor is suitable for power line voltages in the 15 kV to 800 kV range with current sensing up to 5,000 Amps continuous current and 63,000 Amps fault current. The DC current rating is 5,000 Amps provided that there is sufficient AC amperage to energize the energy harvesting current sensor. A typical in-line power line monitor is capable of serial and ethernet wireless communications including DNP 3.0 Modbus protocol. The in-line power line monitor is remotely programmable and compatible with digital relays and RTUs used for automated, remote or manual circuit switching. The typical in-line power line monitor Sensing units do not require batteries and are sealed for life requiring no maintenance. The ICS is a digital measurement and control systems designed as a solutions platform for transmission networks. It is designed to operate in the same harsh environments as our transmission substations and power lines. The in-line power line monitor provides information currently not available on transmission networks on an economic and performance scale previously unrealized.

The in-line power line monitor is a relatively small and light weight sensor system that is suitable for the smart-grid application relying in many points of measurement in the electric power system that would otherwise not be possible. These applications are suitable for overhead lines where the poles are tall and slender, and therefore not able to take the heavy weight of conventional capacitor and transformer-based voltage monitors. The in-line power line monitor is particularly well suited for use with sectionalizing switches where multiple switches located at multiple monitoring and switch points provide fault detection, isolation and restoration. Variations of the sensor may also be deployed as a current-only sensor and as a voltage-only sensor, as desired for various applications.

Capacitance variations in the voltage sensor caused by environmental factors and resistive coupling to the physical support structure can affect the phase angle between the measured current and the measured voltage by as much as 90 degrees, which is a most undesirable consequence. To mitigate these effects, the voltage sensor is electrically connected to the high voltage conductor by a measurement resistor. The current through the measurement resistor is then measured, rather than the voltage of the patch element directly. While the measurement resistor is sufficiently large to keep the sensor current to the microamp range, it is at least an order of magnitude smaller than the parasitic resistance of the support structure, which effectively drowns out the capacitance distortion caused by the parasitic resistance. In this way, the contamination effects, which are predominantly resistive in nature, do not significantly change the phase angle between the measured current and voltage waveforms. Protecting the voltage sensing plate with a material that contains oil or another hydrophobic substance also minimizes surface contamination and oxidation.

The in-line power line monitor can be used in applications where higher precision is needed, which would otherwise require the more bulky and expensive measurement systems. The in-line power line monitor can also be used to obtain voltage as well as current measurements in locations where an accurate voltage reference is not conveniently available. This makes the in-line power line monitor well suited to deployment on radial distribution lines, tie switches and load delivery points. In some cases, the measurement point may be spaced apart from and a particular location (e.g., customer premises location or equipment) creating systematic differences between the measurement point and that location or equipment. In these cases, the knowledge of the physical system configuration between the measurement point and the particular location can be used to determine the intrinsic difference in voltage magnitude and phase angle. Specifically, the length of the line and its configuration produces known and predictable changes in voltage along this line caused by the magnitude of the current flowing on the line and its length.

The in-line power line monitor is also well suited for use in switching, relaying, protection and measurement systems that require fairly high accuracy. The in-line power line monitor often achieves the desired accuracy in lieu of conventional techniques, which avoids the cost and weight of capacitor and transformer-based solutions. In another application, a nearby voltage reference signal is available from one phase with a high degree of accuracy. The in-line power line monitor can be used to continuously update these measured signals with a correction factor to increase the intrinsic accuracy measurements. A voltage reference signal from another device can also be used when monitoring transient voltage and phase angle changes under dynamic conditions. In this case, the percent of change in the voltage reference signal is used to estimate the new voltage condition. When the nominal reference voltage is available, the transient measurement of the reference voltage provides a phase voltage measurement that is better than no information at all, which is accurate to the initial condition assumption. In general, the power line voltage is almost always within 10% of the nominal reference voltage and usually within 5% on the nominal condition. These errors result in power flow calculation errors that remain within usable tolerances for load monitoring functions to determine if power lines and transformers are overloaded, which can be used to determine whether additional load can be transported over the power lines.

The in-line power line monitor can also be used in sectionalizing and other systems that utilize the concurrent voltage to current measurement for phase angle, distance-to-fault and direction-to-fault computations. The combined DC current, AC current and voltage measurements can also be used to compensate for the effect of phase angle error measurements on other systems that compute distance-to-fault estimates. This allows another distance-to-fault system that is intrinsically subject to environmental effects causing relatively low accuracy to be improved substantially, which may render another distance-to-fault system useful in areas that would not otherwise be acceptable.

The general methodology for making the voltage sensor is to utilize a circuit board with a relatively large area dedicated to the exposed high voltage field. This provides a relatively large area for picking up energy from the monitored power line. The capacitance of the voltage sensor can be determined by changing the size and shape of the foil patch and the thickness and material(s) used in the layer(s) between the foil sensing layer and the "ground" plane, which in this case is, in fact, the monitored power line. In other words, the voltage sensor forms a capacitor between the monitored power line and the foil patch, which accumulates electric charge on the foil patch. The high voltage on the power line therefore provides the "ground reference" for measuring the capacitance of the foil patch resulting from the charge induced from the power line. This approach allows the variations in capacitance between the signal plane and the ground plane to be controlled and optimized. Using a relatively large foil patch area produces a relatively large capacitance, which minimizes the effect of variations in capacitance caused by ambient variations and resistive surface contamination on the foil patch. Consistency from one unit to the next is enhanced by using consistent materials and manufacturing practices for the circuit boards to minimize performance variations caused by sub components or assembly variations. The exposed surface of the foil patch is typically flat, which facilitates mitigation techniques and surface treatments to keep moisture off the foil surface. This application of the "Lotus" effect prevents the wetting of the surface and hence minimizes the variations in resistance. Water in its pure form is not conductive and hence has very high resistance. With contamination, water becomes more conductive. A film of water across the surface of the circuit board can cause a change of resistance and hence contribute to measurement errors. The treatment of the surfaces of the circuit board hence minimizes the influence of variable, thus enhancing the consistency of measurements.

The in-line power line monitor may utilize dual electronic measurement of current and voltage as well as dual processing of signals including transmitting and receiving data from the same physical device to enhance reliability. Frequency and antenna diversity reduce the probability of interference. Using antennas with different polarities reduces the susceptibility to interference further. Single frequency narrowband RF transmitters can be disrupted by bystander communication on the same frequency, while the in-line power line monitor may employ two Direct Sequence Spread Spectrum (DSSS) channels simultaneously, rather than hopping between channels. Dual transmitters and receivers also eliminate a single point of failure concern as otherwise any single element can disrupt the signal chain with bad data. In addition, the two signals are compared at the receiving end and used to determine which has the correct uncorrupted signal. This data is spliced together to not allow interference or malfunction of either signal path to cause bad information or signal disruption. This cleansed data is then sent to monitoring and protection system for determining if an action is needed.

The in-line power line monitor includes an onboard power supply coil to power the onboard electronics without the use of batteries or a wired connection. The power supply and current measurement inductive coils use super-saturation cores to prevent the dissipation of high amounts of energy at times when high currents and fault currents occur. This capability is enhanced by using a nano-crystalline core material to get higher output with less core material. This reduces the line current through the sensor electronics to be less than 5% of that previously obtained with thin high permeability nickel materials that cost more. Saturation may be enhanced by using a voltage regulating circuit that allows higher winding voltages compared to shorting semiconductors (e.g., triacs, MOSFETs, etc.) with low ON voltage. More Volts per turn increases the saturation, which limits the heat created in the sensor electronics, while simultaneously allowing more core cross-sectional area to harvest more energy at very low line currents. In addition to allowing operation at a lower current, the high output power supply also turns on quicker (a few milliseconds) to allow the sensor's use in detecting faults, whereas other sensors may take longer than the fault duration itself to power up.

The in-line power line monitor may also include a "ground shield" carried on the circuit board as part of a Faraday cage to minimize interference on the antenna elements and associated signal traces from the power line and other sources. In this embodiment, the antenna elements and signal traces are located behind the shield, which is positioned on the opposing side of the electronics board from the antenna elements. A cup-shaped housing protects the electronics from moisture and high voltage that could interfere with signal processing and sensor measurement. The benefit of using the circuit board is that it can be used to simultaneously mount the voltage sensor and antenna foil patches on one side, while mounting the electronics and the antenna shield on the other side of the circuit board to eliminate bulky connectors, long signals and wired connections on the circuit board. The circuit board also allows for the signal traces from the antenna elements to the radio to be located under the antenna shield so that moisture or other contamination cannot get through.

It is well known that signal traces exposed to high voltage can disrupt signals and cause errors simply because of the high voltage field of application. The arrangement of the patch voltage sensor and antenna elements on the circuit board allows these components to be protected from stray and impulse voltages by placing circuit protection on the circuit board. The cost effectiveness and reliability of the board-mounted antenna shield is significantly enhanced by incorporating the shield on the circuit board rather than using a separate component. This board-mounted shield also provides a mechanical protection zone where potting or filling voids with a mechanical covering filler is then made to avoid moving or lifting of tiny board components. The board-mounted shield can also be configured to create a sealed compartment that protects against any effects of moisture ingress that could damage otherwise unprotected circuit elements. Any compound physically touching surface mount components can exert forces due to different coefficients in thermal expansion that cause them to detach. The board-mounted shield provides a "soft" interface that creates an air chamber between the shield and the electronic components that eliminates this potential issue.

Using the bus bar to mechanically mount the in-line power line monitor with the current sensor and power supply coils surrounding but spaced apart from the bus bar (except on the sides of the bus bar that contact the coils) increases current carrying capacity of the monitored power line by avoiding interference with thermal heat transfer or air flow to the power line conductor or bus. Physically floating the coils around the conductor, and the voltage sensor adjacent to the conductor, without being in direct contact with the conductor, also increases the thermal impedance between the conductor and the sensors. As a result, the power line conductor can reach temperatures in excess of 100° C. without increasing the temperature of the sensor electronics above the maximum rating. The in-line power line monitor also has the advantage of being sufficiently cost effective to allow in-line power line monitors to be installed on many circuit monitoring points, from transmission down to distribution voltages, with the ability to send power line monitoring signals to ground potential receivers without having to make structural changes to existing bus structures or other equipment.

The voltage sensor uses a foil patch on the circuit board which is exposed to the high voltage electric field. The voltage on the foil is proportional to the system voltage. This may change depending on the mechanical geometry of the sensor, which may require calibration and/or tested for each configuration or installation. As there are generally other voltage sources in the environment, such as other phases and perhaps other power lines, these other voltage sources produce electric fields other than the primary voltage that is being measured. The cross-talk contamination signals are a combination of the signals emanating from the earth and the other voltage sources. Determining the actual value of the cross-talk may be resolved by having other combined current and voltage sensors on the voltage sources making similar measurements. Multiple sensor signals are then transmitted to a common controller, which uses the combined signals to compute mathematical corrections to nullify the contamination effect of all of the measurements.

With line currents, faults can generate very high signals which make the current measurement difficult to deal with in actual field conditions. While the voltage sensor has high impulses that can affect the measurements, they are very short in duration and hence are not significant in decision making rules. System voltages are much more stable and predictable than system currents across different sites. The sensor distance from field source is much smaller than the distance from other sources, which increases the accuracy of the measurement. Using temperature and humidity sensors further improve accuracy. For example, a measurement of the bus bar temperature is particularly useful when computing a temperature compensated value for the DC current flowing in the bus bar. As a result, DC current, AC current, AC voltage and phase angle measurements between the AC voltage and AC current become sufficiently accurate to allow electric power system decisions to be based on these measurements, such as sectionalizing switch operation based on direction-to-fault and distance-to-fault computations.

Additionally, calibration can be difficult when there are other voltages present and when there are all three phase currents present. In this case, when one interrupts a line current on a three-phase circuit, there is a time where each phase is interrupted with a stagger between them. In this time the last phase to clear or interrupt is the only true signal for a little over a millisecond. This is enough time to self-calibrate the system. Multiple line operations will cause this to occur on other phases such that this calibration can occur on all three phases from random switch opening. This approach is much easier to implement in the field than to specifically put voltage and current through each phase one at a time, which would take field crews significant time to isolate individual phases in order to accomplish this calibration.

It should be understood that the foregoing relates only to the exemplary embodiments of the present invention, and that numerous changes may be made therein without departing from the spirit and scope of the invention as defined by the following claims.

The invention claimed is:

1. An in-line electric power line monitoring device, comprising:

a bus bar configured to be connected in-line with an electric power line conductor;

an electronics board positioned transverse to the bus bar with the bus bar extending through the electronics board, electronic components carried the electronics board comprising a microprocessor, a memory and a radio, with the memory and the radio carried by the electronics board and operatively connected to the microprocessor;

a voltage sensor and an antenna carried on the electronics board operatively connected to the microprocessor, a pair of DC current measurement pickups spaced apart on the bus bar and operatively connected to the microprocessor;

a power supply coil operatively connected to the microprocessor and positioned transverse to the bus bar with the bus bar extending through the power supply coil, the power supply coil configured to harvest electric energy from the power line conductor and provide the harvested electric energy to power the electronic components;

an AC current sensor coil operatively connected to the microprocessor and positioned transverse to the bus bar with the bus bar extending through the AC current sensor coil;

an electronics board cover positioned transverse to the bus bar with the bus bar extending through the electronics board cover;

an end plate positioned transverse to the bus bar with the bus bar extending through the end plate, with the electronics board, the DC current measurement pickups, the power supply coil, and the AC current sensor coil positioned between the electronics board cover and the end plate.

2. The in-line electric power line monitoring device of claim 1, wherein:

the voltage sensor comprises a foil patch voltage sensor;

the antenna comprises a foil patch antenna element;

the electronic components are carried on a side of the electronics board; and the foil patch voltage sensor and the foil patch antenna element are carried on an opposing side of the electronics board.

3. The in-line electric power line monitoring device of claim 1, wherein:

the voltage sensor comprises four foil patch voltage sensor elements;

the antenna comprises two foil patch antenna elements;

the electronics board comprises a round shape; and the voltage sensor elements each comprise approximately 90° arc segments positioned end-to-end adjacent to the outer perimeter of the electronics board.

4. The in-line electric power line monitoring device of claim 1, wherein the antenna comprises a first foil patch antenna element that transmits communication signals having a first polarity and a second foil patch antenna element that transmits communication signals having a second polarity orthogonal to the first polarity.

5. The in-line electric power line monitoring device of claim 1, further comprising a temperature sensor that generates a temperature signal representative of the bus bar temperature, which the microprocessor uses in temperature compensated computation of DC current flowing in the bus bar.

6. The in-line electric power line monitoring device of claim 1, further comprising:

a first bracket connecting the electronics board cover to the bus bar; and a second bracket connecting the end plate to the bus bar.

7. The in-line electric power line monitoring device of claim 1, wherein the electronic components further comprise a GPS device.

8. An electric power current and voltage monitoring system, comprising:

an electric power switch;

an electric power line conductor;

an in-line electric power line monitoring device connected between the electric power switch and the electric power line conductor, comprising:

a bus bar connected in-line with the electric power line conductor;

an electronics board positioned transverse to the bus bar with the bus bar extending through the electronics board, electronic components carried the electronics board comprising a microprocessor, a memory and a radio, with the memory and the radio carried by the electronics board and operatively connected to the microprocessor;

a voltage sensor and an antenna carried on the electronics board operatively connected to the microprocessor, a pair of DC current measurement pickups spaced apart on the bus bar and operatively connected to the microprocessor;

a power supply coil operatively connected to the microprocessor and positioned transverse to the bus bar with the bus bar extending through the power supply coil, the power supply coil configured to harvest electric energy from the power line conductor and provide the harvested electric energy to power the electronic components;

an AC current sensor coil operatively connected to the microprocessor and positioned transverse to the bus bar with the bus bar extending through the AC current sensor coil;

an electronics board cover positioned transverse to the bus bar with the bus bar extending through the electronics board cover;

an end plate positioned transverse to the bus bar with the bus bar extending through the end plate, with the electronics board, the DC current measurement pickups, the power supply coil, and the AC current sensor coil positioned between the electronics board cover and the end plate.

9. The electric power current and voltage monitoring system of claim 8, wherein:

the voltage sensor comprises a foil patch voltage sensor;

the antenna comprises a foil patch antenna element;

the electronic components are carried on a side of the electronics board; and the foil patch voltage sensor and the foil patch antenna element are carried on an opposing side of the electronics board.

10. The electric power current and voltage monitoring system of claim 8, wherein:

the voltage sensor comprises four foil patch voltage sensor elements;

the antenna comprises two foil patch antenna elements;

the electronics board comprises a round shape; and
the voltage sensor elements each comprise approximately 90° arc segments positioned end-to-end adjacent to the outer perimeter of the electronics board.

11. The electric power current and voltage monitoring system of claim 8, wherein the antenna comprises a first foil patch antenna element that transmits communication signals having a first polarity and a second foil patch antenna element that transmits communication signals having a second polarity orthogonal to the first polarity.

12. The electric power current and voltage monitoring system of claim 8, further comprising a temperature sensor that generates a temperature signal representative of the bus bar temperature, which the microprocessor uses in temperature compensated computation of DC current flowing in the bus bar.

13. The electric power current and voltage monitoring system of claim 8, further comprising:
a first bracket connecting the electronics board cover to the bus bar; and
a second bracket connecting the end plate to the bus bar.

14. The electric power current and voltage monitoring system of claim 8, wherein the electronic components further comprise a GPS device.

15. A method for monitoring an electric power line connected to an electric power switch, comprising:
connecting an in-line electric power line monitoring device to an electric power switch;
connecting an electric power line conductor to the in-line electric power line monitoring device;
the in-line electric power line monitoring device comprising:
a bus bar connected in-line with the electric power line conductor;
an electronics board positioned transverse to the bus bar with the bus bar extending through the electronics board, electronic components carried the electronics board comprising a microprocessor, a memory and a radio, with the memory and the radio carried by the electronics board and operatively connected to the microprocessor;
a voltage sensor and an antenna carried on the electronics board operatively connected to the microprocessor,
a pair of DC current measurement pickups spaced apart on the bus bar and operatively connected to the microprocessor;
a power supply coil operatively connected to the microprocessor and positioned transverse to the bus bar with the bus bar extending through the power supply coil, the power supply coil configured to harvest electric energy from the power line conductor and provide the harvested electric energy to power the electronic components;
an AC current sensor coil operatively connected to the microprocessor and positioned transverse to the bus bar with the bus bar extending through the AC current sensor coil;
an electronics board cover positioned transverse to the bus bar with the bus bar extending through the electronics board cover;
an end plate positioned transverse to the bus bar with the bus bar extending through the end plate, with the electronics board, the DC current measurement pickups, the power supply coil, and the AC current sensor coil positioned between the electronics board cover and the end plate.

16. The method of claim 15, wherein:
the voltage sensor comprises a foil patch voltage sensor;
the antenna comprises a foil patch antenna element;
the electronic components are carried on a side of the electronics board; and
the foil patch voltage sensor and the foil patch antenna element are carried on an opposing side of the electronics board.

17. The method of claim 15, wherein:
the voltage sensor comprises two foil patch voltage sensor elements;
the antenna comprises two foil patch antenna elements;
the electronics board comprises a round shape; and
the voltage sensor elements and the antenna elements each comprise approximately 90° arc segments positioned end-to-end adjacent to the outer perimeter of the electronics board.

18. The method of claim 15, wherein the antenna comprises a first foil patch antenna element that transmits communication signals having a first polarity and a second foil patch antenna element that transmits communication signals having a second polarity orthogonal to the first polarity.

19. The method of claim 15, further comprising receiving a temperature signal representative of the bus bar temperature, and using the temperature signal in temperature compensated computation of DC current flowing in the bus bar.

20. The method of claim 15, wherein the in-line electric power line monitoring device further comprises a first bracket connecting the electronics board cover to the bus bar, and a second bracket connecting the end plate to the bus bar.

* * * * *